(12) United States Patent
Chaudhry et al.

(10) Patent No.: US 11,315,655 B2
(45) Date of Patent: Apr. 26, 2022

(54) LOW POWER MEMORY STATE RETENTION REGULATOR

(71) Applicant: NXP USA, Inc., Austin, TX (US)

(72) Inventors: Nidhi Chaudhry, Austin, TX (US);
Dale John McQuirk, Austin, TX (US);
Miten H. Nagda, Bee Cave, TX (US)

(73) Assignee: NXP USA, Inc., Austin, TX (US)

( * ) Notice: Subject to any disclaimer, the term of this patent is extended or adjusted under 35 U.S.C. 154(b) by 41 days.

(21) Appl. No.: 17/030,134

(22) Filed: Sep. 23, 2020

(65) Prior Publication Data

US 2022/0093204 A1 Mar. 24, 2022

(51) Int. Cl.
*G11C 29/44* (2006.01)
*G11C 7/10* (2006.01)
*G11C 29/12* (2006.01)
*G11C 29/02* (2006.01)
*G11C 7/14* (2006.01)

(52) U.S. Cl.
CPC ............ *G11C 29/44* (2013.01); *G11C 7/1045* (2013.01); *G11C 7/14* (2013.01); *G11C 29/021* (2013.01); *G11C 29/12005* (2013.01); *G11C 29/12015* (2013.01)

(58) Field of Classification Search
CPC ......... G11C 29/44; G11C 7/1045; G11C 7/14; G11C 29/021; G11C 29/12005; G11C 29/12015
See application file for complete search history.

(56) References Cited

U.S. PATENT DOCUMENTS

| 9,123,436 B2 | 9/2015 | Chiou et al. |
| 2005/0134242 A1 | 6/2005 | Gradinariu |

OTHER PUBLICATIONS

Wang et al., "Dynamic-Replica-Based All-Condition-Stable LDO Regulator with 5X Improved Load Regulation," 2018 IEEE International Conference on Integrated Circuits, Technologies and Applications, 2 pages.

*Primary Examiner* — Jerome Leboeuf

(57) ABSTRACT

A regulator includes an error amplifier with a first input coupled to receive a reference voltage and a second input coupled to receive a feedback signal. A driver transistor provides an output voltage of the regulator that powers a memory. A replica transistor provides a replica voltage that powers a replica of the memory. A first ratio of a size of the replica of the memory to a size of the memory is less than one, and a second ratio of a drive strength of the replica transistor to a drive strength of the driver transistor is less than one. Each of the first ratio and the second ratio is at most 1/500. Switching circuitry provides one of the output voltage or the replica voltage as the feedback signal to the error amplifier.

20 Claims, 2 Drawing Sheets

LOW POWER MEMORY STATE RETENTION REGULATOR

BACKGROUND

Field

This disclosure relates generally to voltage regulators, and more specifically, to low power memory state retention regulators.

Related Art

Minimizing the leakage current in volatile memory devices is one of the key parameters of low-power computer designs. In memory retention mode, a part of the memory device is preserved and the power supply to the memory device is reduced to minimize the leakage current.

Some microprocessors do not have the ability to completely shut off the power supply to the processing core while retaining state on a small amount of volatile memory. It is desirable to turn off core power in retention mode, to eliminate core leakage, and switch the retained memory to a lower supply generated from always on battery power supply.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of an integrated circuit for a power regulator disclosed herein provide a proportional driver and proportional replica driver in weak inversion for low power operation during retention mode. The low power replica driver regulator avoids the use of the higher bandwidth and higher power regulator when switching to retention voltage without undershoot and brown out, thereby avoiding loss of information in the volatile memory device due to power shortage. Using a proportional replica of the memory device to accurately replicate the load for pre-boot and switch over allows the feedback control loop to be biased efficiently before the regulator drives the memory load in retention mode and starts without any undershoot at the output. The ability to supply retained memory from second power supply allows the core power supply to be turned off, which completely eliminates the leakage that would otherwise exist from the entire sea-of-gates being powered to retain the memory. Current leakage from MOSFET control gates is used as bias current for low power operation. Using a true replica of the load during retention mode helps the regulator to dynamically adjust the internal node voltages according to the load variations and also with process variations.

Figure 1:
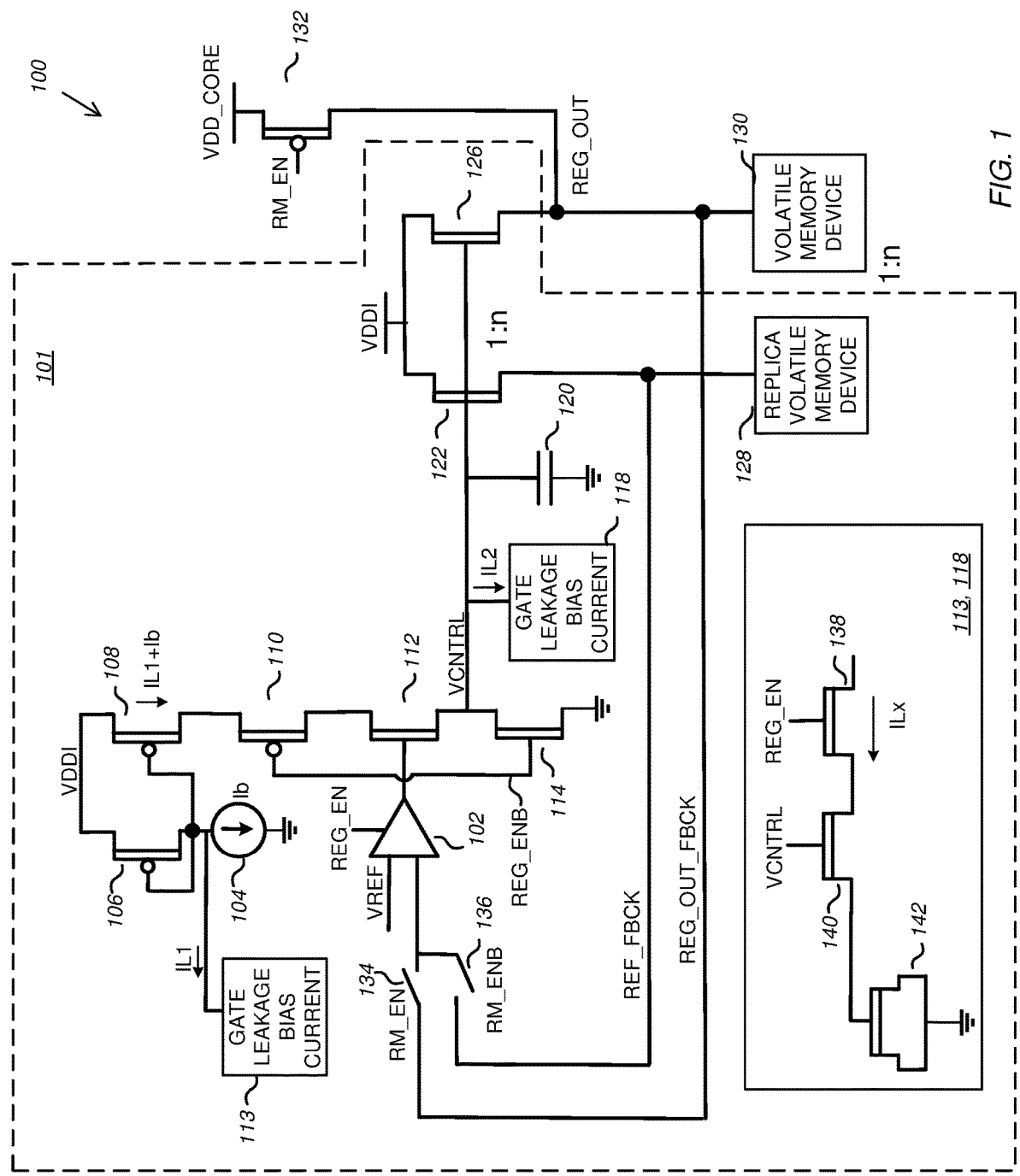
FIG. 1 illustrates a schematic diagram of an embodiment of an integrated circuit for a power regulator for retaining state information in a memory device while minimizing leakage current in accordance with embodiments of the invention.

FIG. 1 illustrates a schematic diagram of an integrated circuit for a power regulator 100 for retaining state information in volatile memory device 130 while minimizing leakage current in accordance with embodiments of the invention. Power regulator 100 includes retention regulator 101 coupled to other components of power regulator 100 that include driver transistor 126, volatile memory device 130 and core supply transistor 132. Retention regulator includes error amplifier 102, current source 104, P-type transistors 106, 108, 110, 112, 114, 122 and 126, gate leakage bias current circuits 113, 118 with N-type transistors 138, 140, 142, capacitor 120, and replica volatile memory device 128.

Error amplifier 102 having a first input coupled to reference voltage (VREF), and a second input coupled to a first feedback signal (REG_OUT_FBCK) during memory retention mode (RM_EN is asserted) through the operation of switch 134 coupling the REG_OUT_FBCK signal to the second input of amplifier 102. A second feedback signal (REF_FBCK) is coupled to the second input of amplifier 102 through switch 136 when not in memory retention mode (RM_EN is not asserted). The REG_OUT_FBCK signal is tapped from a conductor that provides power to drive volatile memory device 130. The REF_FBCK signal is tapped from a conductor that provides power to drive replica volatile memory device 128.

The output of error amplifier 102 is coupled to the control gate of N-type transistor 112. The source electrode of N-type transistor 112 provides a control signal VCNTRL that is coupled to gate leakage bias current circuit 118, a first terminal of capacitor, and the control gates of N-type transistors 122, 126. A second terminal of capacitor 120 is coupled to ground. N-type transistor 122 further includes a drain electrode coupled to a constant voltage source VDDI, such as a battery, and a source electrode coupled to replica volatile memory device 128. N-type transistor 126 further includes a drain electrode coupled to VDDI and a source electrode coupled to volatile memory device 130.

Replica volatile memory device 128 includes the same type of memory cells as volatile memory device 130, but far fewer memory cells. For example, a ratio between the number of memory cells in replica volatile memory device 128 and the number of memory cells in volatile memory device 130 can range from 1:500 to 1:3000 or more. The memory cells in replica volatile memory device 128 and volatile memory device 130 can be implemented as any type of volatile memory cell that is subject to leakage, such as an array of six transistor static random access memory (SRAM) cells. Other suitable types of memory cells, such as dynamic random access memory (DRAM) cells, can be used.

During retention mode, sufficient power to retain the information stored in the memory cells of volatile memory device 130 is provided by supply voltage VDDI, which typically provides relatively low voltage, for example, in the range of 1.7 to 3.6 Volts or other suitable voltage, from a battery or other constant voltage source. When in normal operating mode, a higher level of power is required to read, write, and store information in the memory cells of volatile memory device 130. The higher level of power is provided by core voltage supply VDD_CORE. A switch in the form of P-type transistor 132 includes a source electrode coupled to VDD_CORE, a drain electrode coupled to volatile memory device 130, and a control gate coupled to the retention mode enable signal (RM_EN). When the retention mode enable signal RM_EN is asserted (high), power from VDD_CORE is shut off from volatile memory device 130 by turning off P-type transistor 132, and volatile memory device 130 is instead powered by constant voltage supply VDDI through N-type transistor 126.

Gate leakage bias current circuits 113, 118 can be implemented using N-type transistors 138, 140, and 142. Transistor 138 includes a control gate coupled to the regulator enable signal (REG_EN) and a source electrode coupled to a drain electrode of transistor 140. Transistor 140 further includes a control gate coupled to the voltage control signal (VCNTRL) and a source electrode coupled to a control gate of transistor 142. Transistor 142 further includes source and drain electrodes coupled together to ground.

For gate leakage bias current circuit 113, transistor 138 includes a drain electrode coupled to the output of a current mirror that includes P-type transistors 106 and 108. Source electrodes of transistors 106 and 108 are coupled to constant supply voltage VDDI. The control gates of transistors 106 and 108 are coupled to the source electrode of transistor 106. The drain electrode of transistor 106 is coupled to an input of current source 104 and to an input (drain electrode of transistor 138) of gate leakage bias current circuit 113. The output of current source 104 is coupled to ground. A drain electrode of transistor 108 is coupled to a source electrode of P-type transistor 110. A drain electrode of P-type transistor 110 is coupled to a drain electrode of N-type transistor 112. A source electrode of transistor 112 is coupled to a drain electrode of N-type transistor 114. A source electrode of transistor 114 is coupled to ground. Control gates of transistors 110 and 114 are coupled to the complement of the regulator enable signal (REG_ENB).

For gate leakage bias current circuit 118, the drain electrode of transistor 138 is coupled to the voltage control signal (VCNTRL) between the source electrode of transistor 112 and the drain electrode of transistor 114.

Figure 2:
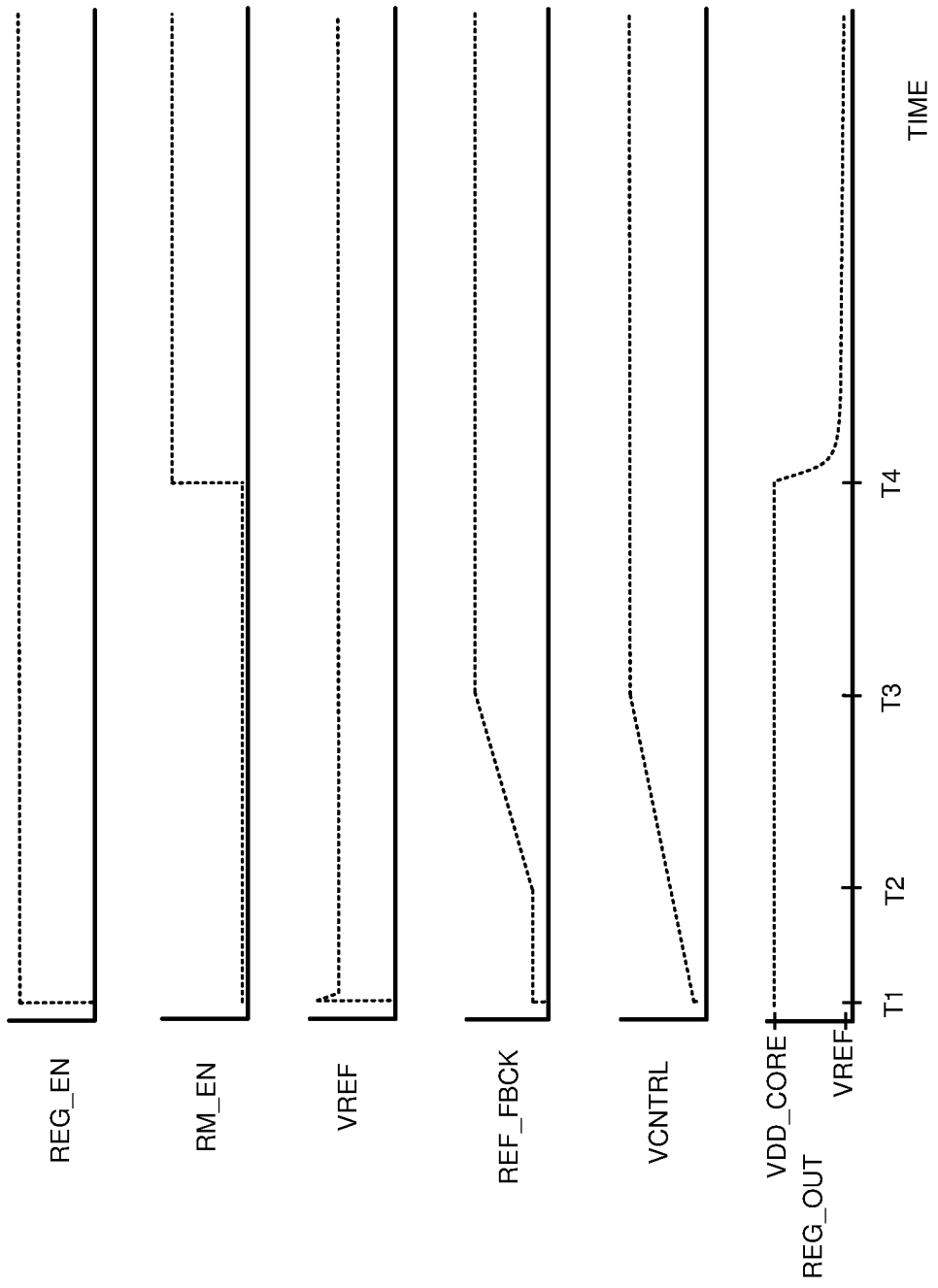
FIG. 2 illustrates a time history of various signals in the power regulator circuit of FIG. 1 according to some embodiments.

The operation of power regulator circuit 100 is described with reference to FIGS. 1 and 2. FIG. 2 illustrates a time history of various signals in the embodiment of power regulator circuit 100 of FIG. 1. In normal run mode, the retention mode enable signal RM_EN is deasserted to disable retention regulator 101. The regulator enable signal REG_EN is asserted. The feedback control loop from the retention mode voltage to volatile memory device 130 to the second input of error amplifier 102 is disabled. P-type transistor 132 is in conductive mode since the retention mode enable signal is deasserted, causing the regulator output signal REG_OUT to be driven to core supply voltage VDD_CORE. Error amplifier 102 is enabled by asserting the regulator enable signal REG_EN.

Before the retention mode starts, a pre-bias mode is entered at time T1 by asserting the standby regulator enable signal REG_EN. The complement of the standby regulator enable signal REG_ENB is thereby deasserted. P-type transistor 132 is in conductive mode so the regulator output signal REG_OUT is still provided by the core voltage supply VDD_CORE. The retention mode enable signal RM_EN is deasserted. The reference voltage VREF is applied at the first input to error amplifier 102. A feedback control loop is turned on since the complement of the retention mode enable signal RM_ENB is asserted, thereby closing switch 136. The complement of the regulator enable signal REG_ENB being deasserted turns P-type transistor 110 on and N-type transistor 114 off. N-type transistor 112 is turned on. The reference feedback signal REF_FBCK is applied to the second input of error amplifier 102. The voltage control signal VCNTRL is charged between time T1 and T3 due to the difference between reference voltage VREF and the reference feedback signal REF_FBCK. N-type transistor 122 drives replica volatile memory device 128 by a factor (1:n) of the actual load of volatile memory device 130 and provides the reference feedback signal REF_FBCK to error amplifier 102 to set the voltage control signal VCNTRL in the control loop before the regulation mode starts. Gate leakage bias current circuits 113, 118 start turning on as voltage control signal VCNTRL is being charged and are fully enabled when voltage control signal VCNTRL is fully asserted at time T3. The driver voltage from N-type transistor 122 initializes the control loop internal voltages before the regulation of the load from volatile memory device 130 begins.

When the voltage control signal VCNTRL is asserted, the gate leakage bias current circuits 113, 118 become active. Current mirror transistors 106, 108 are biased at current Ib from current source 104 and from a small leakage current IL1 from gate leakage bias current 113. The currents ID plus Ib charge the control voltage signal VCNTRL. Another small leakage current IL2 is used to discharge the control voltage VCNTRL when the transistor 112 is off.

Once the retention mode signal RM_EN is asserted at time T4, P-type transistor 132 is disabled and voltage to drive the retention load for volatile memory device 130 is provided by N-type transistor 126. The time history trace for the regulator output signal REG_OUT shows voltage gradually smoothly transitioning from core voltage VDD_CORE to a voltage generated from VDDI starting at time T4. The pre-initialization of the internal nodes helps the regulator output signal REG_OUT to switch from core voltage supply VDD_CORE to reference voltage VREF without undershoot.

By now it should be appreciated that during retention mode, the regulator output feedback signal REG_OUT_FBCK is coupled to the second input of error amplifier 102. A low impedance source-follower stage using transistor 108 drives the output of error amplifier 102, which is referred to as the control voltage signal VCNTRL. The control voltage signal VCNTRL is coupled to control the replica output driver transistor 122 and output driver transistor 126. The reference feedback signal REF_FBCK used during the pre-retention mode helps bias nodes of retention regulator 101 so that undershoot is avoided when retention mode is enabled. The regulator output signal REG_OUT is reduced to low enough voltage to retain the data in volatile memory device 130 while substantially reducing leakage without undershooting the amount of voltage required to retain the data in volatile memory device 130. To achieve low power consumption that is sufficient to retain data in volatile memory device 130, replica driver transistor 122 drives replica volatile memory device 128 with a factor (1:n) of the actual load of volatile memory device 130. Feedback signal REF_FBCK is provided to the error amplifier 102 to set the control voltage signal VCNTRL in the control loop before the retention mode starts, at which point transistor 126 drives the retention load of volatile memory device 130.

In selected embodiments, a regulator can include an error amplifier having a first input coupled to receive a reference voltage and a second input coupled to receive a feedback signal, a first transistor having a gate electrode coupled to an output of the error amplifier, a first current electrode coupled to a first voltage supply terminal which provides a first non-zero voltage, and a second current electrode coupled to a control node, wherein the control node provides a control voltage, a driver transistor having a first current electrode coupled to the first voltage supply terminal, a gate electrode coupled to the control node, and a second current electrode configured to provide an output voltage of the regulator, wherein the output voltage is configured to power a memory, a replica transistor having a first current electrode coupled to the first voltage supply terminal, a gate electrode coupled to the control node, and a second electrode configured to provide a replica voltage, wherein the replica voltage is configured to power a replica of the memory, in which a first ratio of a size of the replica of the memory to a size of the memory is less than one, and a second ratio of a drive strength of the replica transistor to a drive strength of the driver transistor is less than one, and each of the first ratio and the second ratio is at most 1/500, and switching circuitry configured to provide one of the output voltage or the replica voltage as the feedback signal to the error amplifier.

In other aspects, the regulator can further comprise a second transistor having a first current electrode coupled to a second voltage supply terminal, a second current electrode coupled to the second current electrode of the drive transistor, and a gate electrode coupled to receive a retention mode enable signal.

In other aspects, the first voltage supply terminal can be configured to provide a continuous voltage supply which is not powered down during a low power mode, and the second voltage supply terminal is configured to provide a gated voltage supply which is powered down during the low power mode.

In further aspects, the regulator can further comprise a first gate leakage bias circuit coupled to the control node.

In other aspects, the first gate leakage bias circuit can comprise a first leakage transistor having a gate electrode configured to be coupled to the control node when the regulator is enabled, a first current electrode coupled to a second voltage supply terminal and a second current electrode coupled to the second voltage supply terminal, wherein the second voltage supply terminal provides a supply voltage less than the first non-zero voltage.

In further aspects, the regulator can further comprise a current source coupled between a mirror node and a second voltage supply terminal, a second gate leakage bias circuit coupled to the mirror node, and a current mirror configured to provide a mirror current to the first current electrode of the first transistor when the regulator is enabled, wherein the mirror current is proportional to a current through the mirror node.

In other aspects, the first gate leakage bias circuit can comprise a first leakage transistor having a gate electrode configured to be coupled to the control node when the regulator is enabled, a first current electrode coupled to the second voltage supply terminal and a second current electrode coupled to the second voltage supply terminal, and the second gate leakage bias circuit comprises a second leakage transistor having a gate electrode configured to be coupled to the mirror node when the regulator is enabled, a first current electrode coupled to the second voltage supply terminal and a second current electrode coupled to the second voltage supply terminal.

In other aspects, the switching circuit can be configured to provide the replica voltage as the feedback voltage when the regulator is enabled but not operating in a state retention mode, and provide the output voltage as the feedback voltage when the regulator is enabled and operating in the state retention mode.

In further aspects, the regulator can further comprise control circuitry coupled to the regulator, wherein the control circuitry is configured to enable the regulator prior to enabling the state retention mode.

In other aspects, the first ratio can be within 10% of the second ratio.

In other aspects, each of the first ratio and the second ratio can be within a range of 1/500 to 1/3000.

In other aspects, the replica of the memory includes bit cells which match bit cells of the memory.

In other selected embodiments, a regulator can comprise an error amplifier having a first input coupled to receive a reference voltage and a second input coupled to receive a feedback signal, a first transistor having a gate electrode coupled to an output of the error amplifier, a first current electrode coupled to a first voltage supply terminal which provides a first non-zero voltage, and a second current electrode coupled to a control node, wherein the control node provides a control voltage, a driver transistor having a first current electrode coupled to the first voltage supply terminal, a gate electrode coupled to the control node, and a second current electrode configured to provide an output voltage of the regulator, wherein the output voltage is configured to power a memory, and a replica transistor having a first current electrode coupled to the first voltage supply terminal, a gate electrode coupled to the control node, and a second electrode configured to provide a replica voltage, wherein the replica voltage is configured to power a replica of the memory, in which a first ratio of a size of the replica of the memory to a size of the memory is less than one, and a second ratio of a drive strength of the replica transistor to a drive strength of the driver transistor is less than one. The regulator is configured to regulate the replica voltage while using the replica voltage as the feedback signal to the error amplifier for a first time period, and in response to entering a state retention mode after the first time period, regulate the output voltage while using the output voltage as the feedback signal to the error amplifier for a second time period.

In some aspects, the regulator can further comprise a power switch coupled between a second voltage supply terminal and the second current electrode of the drive transistor, wherein the power switch is configured to be turned off in response to entering the state retention mode.

In other aspects, the first and second time periods can be configured to occur while the regulator is enabled.

In further aspects, the regulator can further comprise a first switch coupled between the first voltage supply terminal and the first current electrode of the first transistor, and a second switch coupled between the second current electrode of the first transistor and a second voltage supply terminal, wherein the second voltage supply terminal provides a supply voltage less than the first non-zero voltage, wherein when the regulator is enabled, the first switch is configured to be on and the second switch is configured to be off, and when the regulator is not enabled, the first switch is configured to be off and the second switch is configured to be on.

In further aspects, the regulator can further comprise a first gate leakage bias circuit coupled to the control node.

In further aspects, the first gate leakage bias circuit can comprise a first leakage transistor having a gate electrode configured to be coupled to the control node when the regulator is enabled, a first current electrode coupled to a second voltage supply terminal and a second current electrode coupled to the second voltage supply terminal, wherein the second voltage supply terminal provides a supply voltage less than the first non-zero voltage.

In further aspects, each of the first ratio and the second ratio is within a range of 1/500 to 1/3000.

In further aspects, the first ratio is within 10% of the second ratio.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A regulator comprising:
   an error amplifier having a first input coupled to receive a reference voltage and a second input coupled to receive a feedback signal;
   a first transistor having a gate electrode coupled to an output of the error amplifier, a first current electrode coupled to a first voltage supply terminal which provides a first non-zero voltage, and a second current electrode coupled to a control node, wherein the control node provides a control voltage;
   a driver transistor having a first current electrode coupled to the first voltage supply terminal, a gate electrode coupled to the control node, and a second current electrode configured to provide an output voltage of the regulator, wherein the output voltage is configured to power a memory;
   a replica transistor having a first current electrode coupled to the first voltage supply terminal, a gate electrode coupled to the control node, and a second electrode configured to provide a replica voltage, wherein the replica voltage is configured to power a replica of the memory, in which a first ratio of a size of the replica of the memory to a size of the memory is less than one, and a second ratio of a drive strength of the replica transistor to a drive strength of the driver transistor is less than one, and each of the first ratio and the second ratio is at most 1/500; and
   switching circuitry configured to provide one of the output voltage or the replica voltage as the feedback signal to the error amplifier.

2. The regulator of claim 1, further comprising:
   a second transistor having a first current electrode coupled to a second voltage supply terminal, a second current electrode coupled to the second current electrode of the drive transistor, and a gate electrode coupled to receive a retention mode enable signal.

3. The regulator of claim 2, wherein the first voltage supply terminal is configured to provide a continuous voltage supply which is not powered down during a low power mode, and the second voltage supply terminal is configured to provide a gated voltage supply which is powered down during the low power mode.

4. The regulator of claim 1, further comprising:
   a first gate leakage bias circuit coupled to the control node.

5. The regulator of claim 4, wherein the first gate leakage bias circuit comprises:
   a first leakage transistor having a gate electrode configured to be coupled to the control node when the regulator is enabled, a first current electrode coupled to a second voltage supply terminal and a second current electrode coupled to the second voltage supply terminal, wherein the second voltage supply terminal provides a supply voltage less than the first non-zero voltage.

6. The regulator of claim 4, further comprising:
   a current source coupled between a mirror node and a second voltage supply terminal;
   a second gate leakage bias circuit coupled to the mirror node; and
   a current mirror configured to provide a mirror current to the first current electrode of the first transistor when the regulator is enabled, wherein the mirror current is proportional to a current through the mirror node.

7. The regulator of claim 6, wherein:
   the first gate leakage bias circuit comprises:
      a first leakage transistor having a gate electrode configured to be coupled to the control node when the regulator is enabled, a first current electrode coupled to the second voltage supply terminal and a second current electrode coupled to the second voltage supply terminal, and
   the second gate leakage bias circuit comprises:
      a second leakage transistor having a gate electrode configured to be coupled to the mirror node when the regulator is enabled, a first current electrode coupled to the second voltage supply terminal and a second current electrode coupled to the second voltage supply terminal.

8. The regulator of claim 1, wherein the switching circuit is configured to:
   provide the replica voltage as the feedback voltage when the regulator is enabled but not operating in a state retention mode, and
   provide the output voltage as the feedback voltage when the regulator is enabled and operating in the state retention mode.

9. The regulator of claim 8, further comprising:
   control circuitry coupled to the regulator, wherein the control circuitry is configured to enable the regulator prior to enabling the state retention mode.

10. The regulator circuit of claim 1, wherein the first ratio is within 10% of the second ratio.

11. The regulator circuit of claim 1, wherein each of the first ratio and the second ratio is within a range of 1/500 to 1/3000.

12. The regulator circuit of claim 1, wherein the replica of the memory includes bit cells which match bit cells of the memory.

13. A regulator comprising:
   an error amplifier having a first input coupled to receive a reference voltage and a second input coupled to receive a feedback signal;

a first transistor having a gate electrode coupled to an output of the error amplifier, a first current electrode coupled to a first voltage supply terminal which provides a first non-zero voltage, and a second current electrode coupled to a control node, wherein the control node provides a control voltage;

a driver transistor having a first current electrode coupled to the first voltage supply terminal, a gate electrode coupled to the control node, and a second current electrode configured to provide an output voltage of the regulator, wherein the output voltage is configured to power a memory; and a replica transistor having a first current electrode coupled to the first voltage supply terminal, a gate electrode coupled to the control node, and a second electrode configured to provide a replica voltage, wherein the replica voltage is configured to power a replica of the memory, in which a first ratio of a size of the replica of the memory to a size of the memory is less than one, and a second ratio of a drive strength of the replica transistor to a drive strength of the driver transistor is less than one;

wherein the regulator is configured to:
regulate the replica voltage while using the replica voltage as the feedback signal to the error amplifier for a first time period, and
in response to entering a state retention mode after the first time period, regulate the output voltage while using the output voltage as the feedback signal to the error amplifier for a second time period.

14. The regulator of claim 13, further comprising:
a power switch coupled between a second voltage supply terminal and the second current electrode of the drive transistor, wherein the power switch is configured to be turned off in response to entering the state retention mode.

15. The regulator of claim 13, wherein the first and second time periods are configured to occur while the regulator is enabled.

16. The regulator of claim 15, further comprising:
a first switch coupled between the first voltage supply terminal and the first current electrode of the first transistor; and
a second switch coupled between the second current electrode of the first transistor and a second voltage supply terminal, wherein the second voltage supply terminal provides a supply voltage less than the first non-zero voltage, wherein when the regulator is enabled, the first switch is configured to be on and the second switch is configured to be off, and when the regulator is not enabled, the first switch is configured to be off and the second switch is configured to be on.

17. The regulator of claim 13, further comprising:
a first gate leakage bias circuit coupled to the control node.

18. The regulator of claim 17, wherein the first gate leakage bias circuit comprises:
a first leakage transistor having a gate electrode configured to be coupled to the control node when the regulator is enabled, a first current electrode coupled to a second voltage supply terminal and a second current electrode coupled to the second voltage supply terminal, wherein the second voltage supply terminal provides a supply voltage less than the first non-zero voltage.

19. The regulator circuit of claim 13, wherein each of the first ratio and the second ratio is within a range of 1/500 to 1/3000.

20. The regulator circuit of claim 19, wherein the first ratio is within 10% of the second ratio.

* * * * *